(12) United States Patent
DeCusatis et al.

(10) Patent No.: US 8,671,287 B2
(45) Date of Patent: Mar. 11, 2014

(54) REDUNDANT POWER SUPPLY CONFIGURATION FOR A DATA CENTER

(75) Inventors: Casimer M. DeCusatis, Poughkeepsie, NY (US); Rajaram B. Krishnamurthy, Wappingers Falls, NY (US); Michael Onghena, Poughquag, NY (US); Anuradha Rao, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 12/821,226

(22) Filed: Jun. 23, 2010

(65) Prior Publication Data

US 2011/0320796 A1    Dec. 29, 2011

(51) Int. Cl.
*G06F 1/00*      (2006.01)

(52) U.S. Cl.
USPC .......................................................... 713/300

(58) Field of Classification Search
USPC .................................................. 713/300–340
See application file for complete search history.

(56) References Cited

U.S. PATENT DOCUMENTS

| | | | |
|---|---|---|---|
| 4,104,539 A * | 8/1978 | Hase ................................ | 307/64 |
| 4,611,319 A * | 9/1986 | Naito .......................... | 369/47.45 |
| 4,644,443 A | 2/1987 | Swensen et al. | |
| 5,027,254 A | 6/1991 | Corfits et al. | |
| 5,170,472 A | 12/1992 | Cwiakala et al. | |
| 5,282,274 A | 1/1994 | Liu | |
| 5,430,856 A | 7/1995 | Kinoshita | |
| 5,438,575 A | 8/1995 | Bertrand | |
| 5,465,332 A | 11/1995 | Deloye et al. | |
| 5,465,355 A | 11/1995 | Cook et al. | |
| 5,535,352 A | 7/1996 | Bridges et al. | |
| 5,551,013 A | 8/1996 | Beausoleil et al. | |
| 5,568,365 A | 10/1996 | Hahn et al. | |
| 5,574,873 A | 11/1996 | Davidian | |
| 5,600,805 A | 2/1997 | Fredericks et al. | |
| 5,617,554 A | 4/1997 | Alpert et al. | |
| 5,663,919 A * | 9/1997 | Shirley et al. ................. | 365/226 |
| 5,742,785 A | 4/1998 | Stone et al. | |
| 5,761,448 A | 6/1998 | Adamson et al. | |

(Continued)

FOREIGN PATENT DOCUMENTS

| JP | 57191826 | 11/1982 |
|---|---|---|
| JP | 5981724 | 5/1984 |

(Continued)

OTHER PUBLICATIONS

U.S. Appl. No. 12/821,221, filed Jun. 23, 2010.

(Continued)

*Primary Examiner* — Kim Huynh
*Assistant Examiner* — Alyaa T Mazyad
(74) *Attorney, Agent, or Firm* — Cantor Colburn LLP; Steven Chiu (57) ABSTRACT

A redundant power supply configuration for a data center is provided. A method includes receiving instructions to operate power supplies at a high current mode. An individual current for each of the power supplies is calculated to total a high current at the high current mode. The power supplies are operated at the high current mode to provide the high current at the high current mode. In response to operation at the high current mode being complete, the power supplies are operated at a normal mode to provide a normal current at the normal current mode.

16 Claims, 4 Drawing Sheets

(56) References Cited

U.S. PATENT DOCUMENTS

| | | |
|---|---|---|
| 5,790,825 A | 8/1998 | Traut |
| 5,838,960 A | 11/1998 | Harriman, Jr. |
| 5,870,598 A | 2/1999 | White et al. |
| 5,949,646 A | 9/1999 | Lee et al. |
| 5,960,213 A | 9/1999 | Wilson |
| 5,963,425 A | 10/1999 | Chrysler et al. |
| 6,009,261 A | 12/1999 | Scalzi et al. |
| 6,023,736 A | 2/2000 | Lambeth et al. |
| 6,067,595 A | 5/2000 | Lindenstruth |
| 6,112,311 A | 8/2000 | Beardsley et al. |
| 6,205,530 B1 | 3/2001 | Kang |
| 6,233,693 B1 | 5/2001 | Berglund et al. |
| 6,301,133 B1* | 10/2001 | Cuadra et al. .................. 363/65 |
| 6,308,255 B1 | 10/2001 | Gorishek, IV et al. |
| 6,330,656 B1 | 12/2001 | Bealkowski et al. |
| 6,341,064 B1 | 1/2002 | Bradley |
| 6,349,380 B1 | 2/2002 | Shahidzadeh et al. |
| 6,362,942 B2 | 3/2002 | Drapkin et al. |
| 6,408,347 B1 | 6/2002 | Smith et al. |
| 6,456,498 B1 | 9/2002 | Larson et al. |
| 6,523,140 B1 | 2/2003 | Arndt et al. |
| 6,538,881 B1 | 3/2003 | Jeakins et al. |
| 6,544,311 B1 | 4/2003 | Walton et al. |
| 6,594,148 B1 | 7/2003 | Nguyen et al. |
| 6,595,018 B2 | 7/2003 | Goth et al. |
| 6,625,169 B1 | 9/2003 | Tofano |
| 6,625,648 B1 | 9/2003 | Schwaller et al. |
| 6,643,727 B1 | 11/2003 | Arndt et al. |
| 6,658,599 B1 | 12/2003 | Linam et al. |
| 6,721,813 B2 | 4/2004 | Owen et al. |
| 6,816,590 B2 | 11/2004 | Pike et al. |
| 6,845,428 B1 | 1/2005 | Kedem |
| 6,927,975 B2 | 8/2005 | Crippen et al. |
| 6,950,438 B1 | 9/2005 | Owen et al. |
| 6,973,510 B2 | 12/2005 | Arndt et al. |
| 7,003,615 B2 | 2/2006 | Chui et al. |
| 7,004,233 B2 | 2/2006 | Hasegawa et al. |
| 7,007,099 B1 | 2/2006 | Donati et al. |
| 7,032,052 B2 | 4/2006 | Sauber et al. |
| 7,042,734 B2 | 5/2006 | Hensley et al. |
| 7,053,502 B2* | 5/2006 | Aihara et al. .................. 307/46 |
| 7,062,594 B1 | 6/2006 | Sardella et al. |
| 7,075,788 B2 | 7/2006 | Larson et al. |
| 7,093,155 B2 | 8/2006 | Aoki |
| 7,096,308 B2 | 8/2006 | Main et al. |
| 7,107,331 B2 | 9/2006 | Gava et al. |
| 7,107,495 B2 | 9/2006 | Kitamorn et al. |
| 7,134,040 B2 | 11/2006 | Ayres |
| 7,152,136 B1 | 12/2006 | Charagulla |
| 7,163,546 B2 | 1/2007 | Mirizzi et al. |
| 7,206,946 B2 | 4/2007 | Sakakibara et al. |
| 7,219,181 B2 | 5/2007 | Carty |
| 7,260,620 B1 | 8/2007 | Halasz |
| 7,313,643 B2 | 12/2007 | Sakurai et al. |
| 7,370,224 B1 | 5/2008 | Jaswa et al. |
| 7,457,900 B2 | 11/2008 | Panesar |
| 7,464,174 B1 | 12/2008 | Ngai |
| 7,478,167 B2 | 1/2009 | Ould-Brahim et al. |
| 7,480,303 B1 | 1/2009 | Ngai |
| 7,519,647 B2 | 4/2009 | Carlough et al. |
| 7,525,957 B2 | 4/2009 | Scherer et al. |
| 7,535,828 B2 | 5/2009 | Raszuk et al. |
| 7,546,386 B2 | 6/2009 | Arndt et al. |
| 7,558,348 B1 | 7/2009 | Liu et al. |
| 7,565,463 B2 | 7/2009 | Johnsen et al. |
| 7,594,144 B2 | 9/2009 | Brandyberry et al. |
| 7,613,847 B2 | 11/2009 | Kjos et al. |
| 7,617,340 B2 | 11/2009 | Gregg |
| 7,617,345 B2 | 11/2009 | Clark et al. |
| 7,624,235 B2 | 11/2009 | Wadhawan et al. |
| 7,627,723 B1 | 12/2009 | Buck et al. |
| 7,631,097 B2 | 12/2009 | Moch et al. |
| 7,660,912 B2 | 2/2010 | Gregg |
| 7,676,617 B2 | 3/2010 | Kloeppner |
| 7,729,316 B2 | 6/2010 | Uhlik |
| 7,836,254 B2 | 11/2010 | Gregg et al. |
| 7,873,851 B1* | 1/2011 | Linnell et al. .................. 713/330 |
| 7,975,076 B2 | 7/2011 | Moriki et al. |
| 8,032,684 B2 | 10/2011 | Pettey et al. |
| 8,041,811 B2 | 10/2011 | Calippe et al. |
| 8,046,627 B2 | 10/2011 | Takubo |
| 8,082,466 B2 | 12/2011 | Tanaka et al. |
| 8,140,917 B2 | 3/2012 | Suetsugu et al. |
| 2002/0112067 A1 | 8/2002 | Chang et al. |
| 2003/0056155 A1 | 3/2003 | Austen et al. |
| 2003/0058618 A1 | 3/2003 | Soetemans et al. |
| 2003/0097503 A1 | 5/2003 | Huckins |
| 2003/0177221 A1 | 9/2003 | Ould-Brahim et al. |
| 2003/0198180 A1 | 10/2003 | Cambron |
| 2003/0200477 A1 | 10/2003 | Ayres |
| 2004/0024905 A1 | 2/2004 | Liao et al. |
| 2004/0117534 A1 | 6/2004 | Parry et al. |
| 2004/0130868 A1 | 7/2004 | Schwartz et al. |
| 2004/0133819 A1 | 7/2004 | Krishnamurthy et al. |
| 2004/0136130 A1 | 7/2004 | Wimmer et al. |
| 2004/0199700 A1 | 10/2004 | Clayton |
| 2005/0024187 A1* | 2/2005 | Kranz et al. ................ 340/10.33 |
| 2005/0033895 A1 | 2/2005 | Lueck et al. |
| 2005/0071472 A1 | 3/2005 | Arndt et al. |
| 2005/0091438 A1 | 4/2005 | Chatterjee |
| 2005/0116546 A1* | 6/2005 | Zeighami et al. ................ 307/51 |
| 2005/0146855 A1 | 7/2005 | Brehm et al. |
| 2005/0160214 A1 | 7/2005 | Sauber et al. |
| 2005/0162830 A1 | 7/2005 | Wortman et al. |
| 2005/0182862 A1 | 8/2005 | Ritz et al. |
| 2005/0213513 A1 | 9/2005 | Ngo et al. |
| 2005/0276017 A1 | 12/2005 | Aziz et al. |
| 2005/0286187 A1 | 12/2005 | Liu et al. |
| 2005/0289271 A1 | 12/2005 | Martinez et al. |
| 2005/0289278 A1 | 12/2005 | Tan et al. |
| 2006/0053339 A1 | 3/2006 | Miller et al. |
| 2006/0067069 A1 | 3/2006 | Heard et al. |
| 2006/0085150 A1 | 4/2006 | Gorin |
| 2006/0085573 A1 | 4/2006 | Pike et al. |
| 2006/0087813 A1 | 4/2006 | Becker et al. |
| 2006/0087814 A1 | 4/2006 | Brandon et al. |
| 2006/0095607 A1 | 5/2006 | Lim et al. |
| 2006/0195644 A1 | 8/2006 | Arndt et al. |
| 2006/0206639 A1 | 9/2006 | Tee et al. |
| 2006/0230208 A1 | 10/2006 | Gregg et al. |
| 2006/0236054 A1 | 10/2006 | Kitamura |
| 2006/0237636 A1* | 10/2006 | Lyons et al. .................. 250/228 |
| 2006/0253619 A1 | 11/2006 | Torudbakken et al. |
| 2006/0288130 A1 | 12/2006 | Madukkarumukumana et al. |
| 2006/0291447 A1 | 12/2006 | Siliquini et al. |
| 2007/0008663 A1 | 1/2007 | Nakashima et al. |
| 2007/0069585 A1 | 3/2007 | Bosco et al. |
| 2007/0073955 A1 | 3/2007 | Murray et al. |
| 2007/0078996 A1 | 4/2007 | Chen et al. |
| 2007/0136554 A1 | 6/2007 | Biran et al. |
| 2007/0168636 A1 | 7/2007 | Hummel et al. |
| 2007/0183393 A1 | 8/2007 | Boyd et al. |
| 2007/0186074 A1 | 8/2007 | Bradford et al. |
| 2007/0211430 A1 | 9/2007 | Bechtolsheim |
| 2007/0226386 A1 | 9/2007 | Sharp et al. |
| 2007/0226523 A1* | 9/2007 | Chang .......................... 713/300 |
| 2007/0239922 A1 | 10/2007 | Koishi |
| 2007/0245041 A1 | 10/2007 | Hua et al. |
| 2007/0262891 A1 | 11/2007 | Woodral et al. |
| 2007/0271559 A1 | 11/2007 | Easton et al. |
| 2007/0273018 A1 | 11/2007 | Onozuka et al. |
| 2007/0273401 A1 | 11/2007 | Kiryu |
| 2007/0274039 A1 | 11/2007 | Hamlin |
| 2008/0043405 A1 | 2/2008 | Lee et al. |
| 2008/0065796 A1 | 3/2008 | Lee et al. |
| 2008/0069141 A1 | 3/2008 | Bonaguro et al. |
| 2008/0077817 A1* | 3/2008 | Brundridge et al. .......... 713/340 |
| 2008/0091851 A1 | 4/2008 | Sierra |
| 2008/0091868 A1 | 4/2008 | Mizrachi et al. |
| 2008/0091915 A1 | 4/2008 | Moertl et al. |
| 2008/0114906 A1 | 5/2008 | Hummel et al. |
| 2008/0126648 A1 | 5/2008 | Brownlow et al. |
| 2008/0126652 A1 | 5/2008 | Vembu et al. |
| 2008/0147943 A1 | 6/2008 | Freimuth et al. |

(56) References Cited

U.S. PATENT DOCUMENTS

| | | |
|---|---|---|
| 2008/0148295 A1 | 6/2008 | Freimuth et al. |
| 2008/0162865 A1 | 7/2008 | Koufaty et al. |
| 2008/0168208 A1 | 7/2008 | Gregg |
| 2008/0189577 A1 | 8/2008 | Arndt et al. |
| 2008/0192431 A1 | 8/2008 | Bechtolsheim |
| 2008/0209114 A1 | 8/2008 | Chow et al. |
| 2008/0222406 A1 | 9/2008 | Tabuchi |
| 2008/0235425 A1 | 9/2008 | Belmar et al. |
| 2008/0239687 A1 | 10/2008 | Leigh et al. |
| 2008/0239945 A1 | 10/2008 | Gregg |
| 2008/0259555 A1 | 10/2008 | Bechtolsheim et al. |
| 2008/0263246 A1 | 10/2008 | Larson et al. |
| 2008/0270853 A1 | 10/2008 | Chagoly et al. |
| 2008/0288661 A1 | 11/2008 | Galles |
| 2009/0037682 A1 | 2/2009 | Armstrong et al. |
| 2009/0070760 A1 | 3/2009 | Khatri et al. |
| 2009/0125666 A1 | 5/2009 | Freking et al. |
| 2009/0144462 A1 | 6/2009 | Arndt et al. |
| 2009/0144731 A1 | 6/2009 | Brown et al. |
| 2009/0182966 A1 | 7/2009 | Greiner et al. |
| 2009/0182969 A1 | 7/2009 | Norgaard et al. |
| 2009/0210527 A1 | 8/2009 | Kawato |
| 2009/0210646 A1 | 8/2009 | Bauman et al. |
| 2009/0222814 A1 | 9/2009 | Astrand |
| 2009/0234987 A1 | 9/2009 | Lee et al. |
| 2009/0240849 A1 | 9/2009 | Corneli et al. |
| 2009/0249039 A1 | 10/2009 | Hook et al. |
| 2009/0276551 A1 | 11/2009 | Brown et al. |
| 2009/0276773 A1 | 11/2009 | Brown et al. |
| 2009/0276774 A1 | 11/2009 | Kinoshita |
| 2009/0328035 A1 | 12/2009 | Ganguly |
| 2010/0005234 A1 | 1/2010 | Ganga et al. |
| 2010/0005531 A1 | 1/2010 | Largman et al. |
| 2010/0027559 A1 | 2/2010 | Lin et al. |
| 2010/0042999 A1 | 2/2010 | Dorai et al. |
| 2010/0077117 A1 | 3/2010 | Asnaashari |
| 2010/0115329 A1 | 5/2010 | Tanaka et al. |
| 2010/0131359 A1 | 5/2010 | Ting et al. |
| 2010/0146089 A1 | 6/2010 | Freimuth et al. |
| 2010/0157463 A1* | 6/2010 | Arizono et al. ............ 360/73.03 |
| 2010/0169674 A1* | 7/2010 | Kazama et al. ............... 713/300 |
| 2010/0205608 A1 | 8/2010 | Nemirovsky et al. |
| 2010/0211714 A1 | 8/2010 | LePage |
| 2010/0287209 A1 | 11/2010 | Hauser |
| 2010/0312894 A1 | 12/2010 | Awad et al. |
| 2011/0029696 A1 | 2/2011 | Uehara |
| 2011/0029734 A1 | 2/2011 | Pope et al. |
| 2011/0131359 A1 | 6/2011 | Pettey et al. |
| 2011/0219161 A1 | 9/2011 | Deshpande et al. |
| 2011/0258352 A1 | 10/2011 | Williams et al. |
| 2011/0265134 A1 | 10/2011 | Jaggi et al. |
| 2011/0317351 A1 | 12/2011 | Pizzolato et al. |
| 2011/0317743 A1 | 12/2011 | DeCusatis et al. |
| 2011/0320602 A1 | 12/2011 | Carlson et al. |
| 2011/0320653 A1 | 12/2011 | Lais et al. |
| 2011/0320666 A1 | 12/2011 | Gregg et al. |
| 2011/0320670 A1 | 12/2011 | Bayer et al. |
| 2011/0320674 A1 | 12/2011 | Gregg et al. |
| 2011/0320675 A1 | 12/2011 | Gregg et al. |
| 2011/0320703 A1 | 12/2011 | Craddock et al. |
| 2011/0320861 A1 | 12/2011 | Bayer et al. |
| 2011/0320887 A1 | 12/2011 | Craddock et al. |
| 2011/0320892 A1 | 12/2011 | Check et al. |

FOREIGN PATENT DOCUMENTS

| | | |
|---|---|---|
| JP | 6279557 | 4/1987 |
| JP | 0553973 | 3/1993 |
| WO | WO9600940 | 11/1996 |
| WO | 2009027189 A1 | 3/2009 |

OTHER PUBLICATIONS

U.S. Appl. No. 12/821,222, filed Jun. 23, 2010.
U.S. Appl. No. 12/821,224, filed Jun. 23, 2010.
U.S. Appl. No. 12/821,239, filed Jun. 23, 2010.
U.S. Appl. No. 12/821,242, filed Jun. 23, 2010.
U.S. Appl. No. 12/821,243, filed Jun. 23, 2010.
U.S. Appl. No. 12/821,245, filed Jun. 23, 2010.
U.S. Appl. No. 12/821,247, filed Jun. 23, 2010.
U.S. Appl. No. 12/821,248, filed Jun. 23, 2010.
U.S. Appl. No. 12/821,250, filed Jun. 23, 2010.
U.S. Appl. No. 12/821,256, filed Jun. 23, 2010.
U.S. Appl. No. 12/821,271, filed Jun. 23, 2010.
Baumann, Andrew, et al., "The Multikernel: A New OS Architecture for Scalable Multicore Systems," Oct. 2009, SOSP'09, Oct. 11-14, 2009, Big Sky, Montana, USA, pp. 29-43.
Crawford et al. "Accelerating Computing with the Cell Broadband Engine Processor"; CF'08, May 5-7, 2008; Ischia, Italy; Copyright 2008 ACM 978-1-60558-077.
Darren Abramson et al.; "Intel Virtualization Technology for Directed I/O"; Intel Technology Journal, vol. 10, Issue 3, Aug. 10, 2006; pp. 1-16.
Huang, Wei et al., "A Case for High Performance Computing with Virtual Machines," ISC '06, Jun3 28 30, Carins, Queensland, Australia, pp. 125-134, Jun. 3, 2006.
"Intel (registered trademark) Itanium (registered trademark) Architecture Software Developer's Manual," vol. 2, Rev. 2.2, Jan. 2006.
"z/VM: General Information Manual," IBM Publication No. GC24-5991-05, May 2003.
"DMA Engines Bring Mulicast to PCI Express Systems," http://electronicdesign.com, Aug. 13, 2009, 3 pages.
"I/O Virtualization and AMD's IOMMU," AMD Developer Central, http://developer.amd.com/documentation/articles/pages.892006101.aspx, Aug. 9, 2006.
"IBM Enhances the IBM eServer zSeries 990 Family of Servers," Hardware Announcement, Oct. 7, 2003, pp. 1-11.
Internet Article, "Large Page Support in the Lunux Kernel," http://lwn.net./Articles/6969/<retrieved on Jan. 26, 2010>.
K. Vaidyanathan et al.; "Exploiting RDMA Operations for Providing Efficient Fine-Grained Resource Monitoring in Cluster-Based Servers"; Jun. 2006; pp. 10; Downloaded: Apr. 13, 2010 at 18:53:46 UTC from IEEE Xplore. 1-4244-0328-6/06.
Mysore Shashidhar et al., "Understanding and Visualizing Full Systems with Data Flow Tomography" SPOLOS '08, Mar. 1-5, 2008, Seattle, Washington, USA, pp. 211-221.
Narayanan Ganapathy et al.; Papers—USENIX Annual Teleconference (No. 98); Entitled: "General Purpose Operating System Support for Multiple Page Sizes" 1998; pp. 1-9.
Non-Final Office Action mail date Jan. 10, 2011.
Paulsen, Erik; "Local Memory Coaxes Top Speed from SCSI Masters"; Electronic Design, v. 41, (Apr. 15, 1993) p. 75-6+.
Swift, Micael M. et al., "Improving the Reliability of Commodity Operating Systems," ACM Transactions on Computer Systems, vol. 23, No. 1, Feb. 2005, pp. 77-110.
Talluri et al., "A New Page Table for 64-bit Address Spaces," ACM SIGOPS Operating Systems Review, vol. 29, Issue 5 (Dec. 1995), pp. 194-200.
VTdHowTo—Xen Wiki; Downloaded—Apr. 16, 2010; pp. 1-5; http://wiki.xensource.com/xenwiki/VTdHowTo.
Winwood, Simon, et al., "Multiple Page Size Support in the Linux Kernel", Proceedings of Ottawa Linux Symposium, 2002.
Xu, Min et al., "Towards a VMM-based Usage Control Framework for OS Kernel Integrity Protection," SACMAT '07, Jun. 20-22, 2007, Sophia Antipolis, France, pp. 71-80.
z/VM: Running Guest Operating Systems, IBM Publication No. SC24-5997-02, Oct. 2001.
U.S. Appl. No. 12/821,124, filed Jun. 23, 2010.
U.S. Appl. No. 12/821,181, filed Jun. 23, 2010.
U.S. Appl. No. 12/821,182, filed Jun. 23, 2010.
U.S. Appl. No. 12/821,185, filed Jun. 23, 2010.
U.S. Appl. No. 12/821,191, filed Jun. 23, 2010.
U.S. Appl. No. 12/821,648, filed Jun. 23, 2010.
z/Architecture Principles of Operation, Feb. 2009; pp. 1-1344.
Dolphin Interconnect Solutions; MySQL Acceleration Solutions; Solid State Storage; Embeded and HPC Solutions; "DXH510 PCI Express Host Adapter"; ww.dolphinics.com/products/pent-dxseries-dsh510.html downloaded Jun. 10, 2010.

(56) References Cited

OTHER PUBLICATIONS

J. Regula, "Using Non-transparent Bridging in PCI Express Systems", PLX Technology, Inc., pp. 1-31; Published: Jun. 1, 2004.
Jack Regula; "Ethernet Tunneling through PCI Express Inter-Processor Communication, Low Latency Storage IO Source"; www.wwpi.com; publisher: Computer Technology Review; Jan. 19, 2009.
Robert F. Kern, "IBM System z & DS8000 Technology Synergy", IBM ATS Americas Disk Storage; Jul. 21, 2009, pp. 1-25.
Szwed et al.; "Managing Connected PCI Express Root Complexes"; Dated: Dec. 23, 2009—6 pages.
U.S. Appl. No. 12/821,221, Final Office Action mail date Jun. 15, 2011.
International Search Report for PCT/EP2011/059810, Sep. 14, 2011.
PCI Express Base Specification Rev 1.0a, Apr. 15, 2003 p. 1-2, 31, 35-36, 43-44, 49-51, 55, 59-62, 74, 101.
Non-final office Action received for U.S. Appl. No. 12/821,239 dated Nov. 8, 2012; pp. 1-44.
Final Office Action dated Aug. 30, 2012 for U.S. Appl. No. 12/821,245; pp. 1-28.
Non-final Office Action dated Sep. 26, 2012 for U.S. Appl. No. 12/821,243; pp. 1-25.
Final Office Action dated Sep. 13, 2012 for U.S. Appl. No. 12/821,256; pp. 1-23.
Final Office Action received Oct. 10, 2012 for U.S. Appl. No. 12/821,221; p. 1-15.
Non-final Office Action dated Jun. 5, 2012 for U.S. Appl. No. 12/821,221; pp. 1-14.
Non-final Office Action received Oct. 11, 2012 for U.S. Appl. No. 12/821,247; pp. 1-46.
Notice of Allowance dated Sep. 19, 2012 for U.S. Appl. No. 12/821,224; pp. 1-8.
Final Office Action dated Jul. 19, 2012 for U.S. Appl. No. 12/821,250, pp. 1-23.
Non Final Office Action recieved May 8, 2012 for U.S. Appl. No. 12/821,243; pp. 1-28.
Non Final Office Action received Mar. 15, 2012 for U.S. Appl. No. 12/821,242; pp. 1-28.
Non Final Office Action received May 4, 2012 for U.S. Appl. No. 12/821,256; pp. 1-36.

* cited by examiner

REDUNDANT POWER SUPPLY CONFIGURATION FOR A DATA CENTER

BACKGROUND

Exemplary embodiments relate generally to redundant power supplies, and more particularly to power management of redundant power supplies.

There are significant industry-wide concerns with energy consumption in modern data centers. A data center or datacenter, also called a server farm, is a facility used to house computer systems and associated components, such as telecommunications and storage systems. It generally includes redundant or backup power supplies, redundant data communications connections, environmental controls (e.g., air conditioning, fire suppression) and security devices. The cost of providing electrical power to a data center has become a dominant purchasing consideration, which many consider to be more significant than the cost of the actual hardware, software, and management services. Recent industry reports indicate that data center power consumption has doubled in the past 5 years, and will double again in the next 5 years unless steps are taken to mitigate this trend. Recognizing this, IBM® and many other companies have begun "green" or environmentally friendly initiatives.

BRIEF SUMMARY

An exemplary embodiment provides a method for power supply operation. An instruction is received to operate power supplies at a high current mode. An individual current for each of the power supplies is calculated to total a high current at the high current mode. The power supplies are operated at the high current mode to provide the high current at the high current mode. In response to operation at the high current mode being complete, the power supplies are operated at a normal mode to provide a normal current at the normal current mode.

An addition exemplary embodiments provides a power system. The power system includes power supplies configured to provide redundant power a power manager configured to control the power supplies. The power manager is configured to receive an instruction to operate the power supplies at a high current mode, calculate an individual current for each of the power supplies in which a total of the individual current amounts to a high current at the high current mode, operate the power supplies at the high current mode to provide the high current. In response to operation at the high current mode being complete, the power manager is configured to operate the power supplies at a normal mode to provide a normal current at the normal mode.

A further exemplary embodiment provides a computer program product, tangibly embodied on a computer readable medium, and the computer program product includes instructions for causing a computer to execute a method for power supply operation. An instruction is received to operate power supplies at a high current mode. An individual current for each of the power supplies is calculated to total a high current at the high current mode. The power supplies are operated at the high current mode to provide the high current at the high current mode. In response to operation at the high current mode being complete, the power supplies are operated at a normal mode to provide a normal current at the normal current mode.

Additional features and details are realized through the techniques of the present invention. Other embodiments and features are described in detail herein and are considered a part of the claimed invention. For a better understanding of features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Exemplary embodiments are configured to exploit many opportunities to not only make more efficient use of energy in servers and storage devices, but to improve the response time of these systems. Current storage controllers use a digitally controlled power supply capable of producing many different levels of output current. For redundancy and high availability, at least two power supplies are configured for each system. Recent IBM® storage control units employ an N+1=3 design point, with 3 redundant power supplies, to insure there is never a single point of failure in the power distribution system. However, current power supply designs may not utilize the redundant power supplies to their full potential, resulting in all the power supplies running at suboptimal efficiency. In accordance with exemplary embodiments, it is possible to use the excess capacity of the N+1 power supplies to achieve higher drive currents, which means more efficient operating points and faster spin-up times for disk storage.

Exemplary embodiments provide a method and apparatus to utilize excess capacity available in redundant power supplies to achieve higher drive currents. This results in the power supplies operating at higher overall efficiency, as well as providing faster start-up for disk storage for higher performance in accordance with exemplary embodiments.

Figure 1:
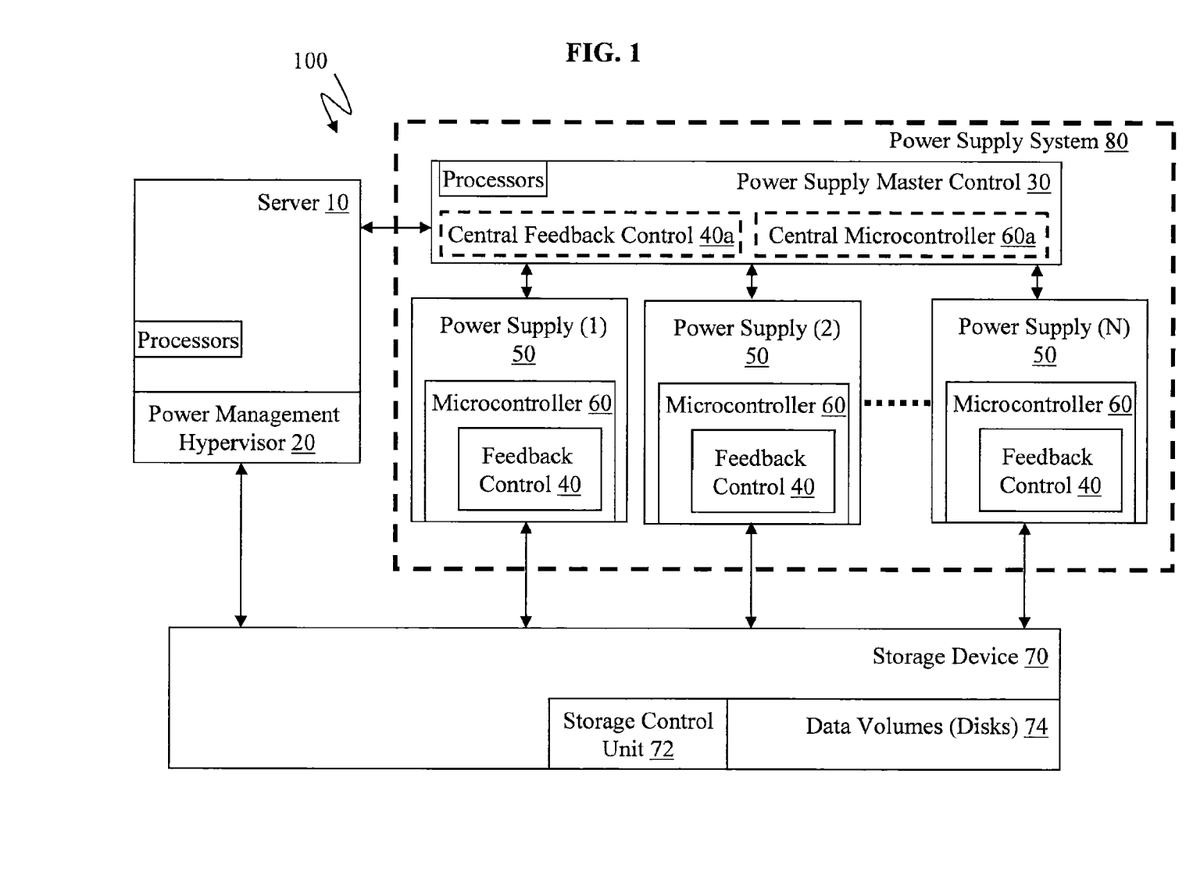
FIG. 1 depicts a block diagram of a system in accordance with exemplary embodiments.

FIG. 1 depicts a block diagram 100 illustrating a system in accordance with exemplary embodiments.

In the block diagram 100, a server 10 is operatively connected to a power supply system 80. The server includes the hardware and software to operate as a server as understood by one skilled in the art. The power supply system 80 includes a power supply master control 30 that is configured to control a plurality of redundant power supplies 50. There may be 1 to N redundant power supplies 50, where N represents the last power supply 50. Each redundant power supply 50 includes a microcontroller 60 and a feedback controller 40. A microcontroller (also microcomputer, MCU or μC) may be a small computer on a single integrated circuit consisting internally of a relatively simple central processing unit (CPU), clock, timers, input/output (I/O ports, and memory. Program memory is also often included on chip. Microcontrollers are designed for small or dedicated applications. They will generally have the ability to retain functionality while waiting for an event such as a button press or other interrupt; power consumption while sleeping (CPU clock and most peripherals off) may be just nanowatts, making many of them well suited for long lasting battery applications. Other microcontrollers may serve performance-critical roles, where they may need to act more like a digital signal processor (DSP), with higher clock speeds and power consumption.

Note that although each redundant power supply 50 has its own microcontroller 60 for controlling the power supply 50, the functionality of the individual microcontrollers 60 may optionally be implemented in one central microcontroller 60a (shown with dashed lines) for all the power supplies 50, and the central power supply 60a may be included in the power supply master control 30. In exemplary embodiments, any discussion for the microcontroller 60 can apply to the central microcontroller 60a. Also, note that each power supply 50 is configured to output power and comprises all the software and hardware to operate as a power supply as understood by one by one skilled in the art.

The server 10 and the power supply system 80 may be operatively connected to one or more storage devices 70. As understood by one skilled in the art, the storage device 70 may include a storage control unit 72 that is configured to control data volumes 74. The volumes 74 may include disks for storing (recording) the data. Disk storage or disc storage is a general category of storage mechanisms, in which data are digitally recorded by various electronic, magnetic, optical, or mechanical methods on a surface layer deposited on one or more planar, round, and rotating platters. The storage device 70 includes a disk drive which may have a mechanical arm or mechanism for accessing the disks, such as for reading and writing (storage). The disks 74 spin by receiving power from the power supply system 80. For example, the storage device 70 may include the features of a direct access storage device (DASD).

A software component such as a power management hypervisor 20 is configured to request and manage power needed to run the storage device 70. The power management hypervisor 20 instructs the power supply master control 30 of the power needs for the storage device 70. The power supply master control 30 instructs the power supplies 50 to supply power to the storage device 70 at the appropriate times.

For example, the power supply system 80 may employ 3 redundant power supplies 50 under digital control of the power supply master control 30, such that each redundant power supply 50 is operational all of the time. In this manner, failure of a single power supply 50 will not disrupt operation of the storage device 70, and the remaining power supplies 50 are designed to automatically pick up the excess power load required to keep the storage device 70 operational. One power supply such as the power supply 50, typically drives a maximum of 120 amps, and is programmable with 12-24 discrete output current levels, adjustable in 0.1 amp increments. For example, disk storage controllers (such as the storage control unit 72) may require a total of 2.722 kW with 14 adjustable output levels, or 1.806 kW with 18 output levels. In the normal mode, each power supply 50 in a redundant configuration runs at 20-25% of its peak load, which means the power supply is operating at about 60% efficiency. It is understood that some power supplies 50 may run somewhat less or more than the 20-25%, but the present disclosure notes this range at about ¼ of its peak load (which is ¼ of its maximum capacity or ¼ of its peak current).

However, in high current output mode (or high current mode), exemplary embodiments are configured to increase the efficiency for the power supplies 50 by modifying the firmware (or software) of the power supply master control 30 and the firmware (or software) of the microcontroller 60, such that each power supply 50 runs at (and/or near) 100% of its peak efficiency point (35%-70% of maximum capacity); even if the power supply 50 runs at less than 100% of its peak load it is understood that this still refers to running at high current output mode. Higher efficiencies are achieved with output currents that are in 35%-70% maximum output capacity of the power supplies 50. In exemplary embodiments, the firmware (of the power supply master control 30) controlling the power supplies 50 is reprogrammed to provide higher output current to the storage device 70 under certain conditions, for example, during spin-up of the disks 74 from a reboot and/or spin-up from a quiescent state. The quiescent state is when the disks 74 are at rest (i.e., not spinning). When the power supply master control 30 communicates with the microcontrollers 60 to cause the (three) redundant power supplies 50 to output high currents (peak currents), the power supply system 80 is operating in high current output mode (or high current mode).

One skilled in the art understands the relationship between power (P), current (I), volts (V), and resistance (R)/impedance (Z). Note that high current mode is utilized for explanation purposes and exemplary embodiments may have high voltage mode, high power mode, etc. Also, running the power supplies 50 at 100% of their peak (maximum) efficiency point (e.g., 50%-70% of their maximum capacity) is not meant to be limiting. For example, there may be power supplies 50 that have a maximum efficiency point at 45% of their load, and the maximum efficiency point is the load at which the power supply 50 operates with the lowest losses. So there may be power supplies 50 that each have a 100 ampere (amp) maximum current, and the maximum efficiency point for each power supply 50 is at 50 amps. Accordingly, when the power supply master control 30 instructs the microcontrollers 60 to drive each power supply 50 at its maximum efficiency point (which is 50% in this example) at the high current mode, each respective microcontroller 60 causes its power supply 50 to output 50 amps of current. If those same power supplies 50 had a maximum efficiency point at 70% of its load, the microcontrollers 60 would then drive each respective power supply 50 at 70 amps of current. It is understood that during the high current mode each power supply 50 may operate at a range of its maximum efficiency point, such as plus or minus (+/−) 20% of its maximum efficiency point. Even though examples may be utilized in which the power supplies 50 operate at different maximum (peak) efficiency points (where the maximum efficiency point is at, e.g. 50% of its peak current), it is understood that exemplary embodiments apply to power supplies 50 that operate at other maximum efficiency points and the present disclosure is not meant to be limited to power supplies 50 that only have a maximum efficiency point (in the range of) 50% of its peak current. For example, a high efficiency range for the power supplies 50 to operate is 35%-70% of peak current, and a higher efficiency range for the power supplies 50 to operate is 45%-50% of peak current.

When operating in the high current output mode, the power supplies 50 may not have enough excess capacity to provide fully redundant backup for each other; however, the power supplies 50 can deliver improved efficiency. The currents required in high current mode are within the capacity of current power supplies, which can deliver current steps up to 100 amps (or 100% of their load). At the higher output currents of the high current mode, the power supply 50 can achieve close to 95% efficiency; the heat generated while operating in this high current mode is actually less than when the power supply 50 is running at only 20% of its peak load (which is considered the normal mode), and thus the cooling requirement is reduced. Since the redundant power supplies 50 are designed to operate up to these maximum levels (as operated in the high current mode), there is no impact on their performance or individual reliability.

Moreover, in the high current mode, the increased power supply current of the redundant power supplies 50 allows disk storage 74 of the storage device 70 to spin up more quickly from a quiescent state. The start-up time for a storage disk 74 is roughly proportional to the disk drive current received from the power supplies 50; by the power supply master control 30 doubling the drive current provided to the storage device 70 in the high current mode, for example, the time to spin-up the disks 74 to operational speed is reduced by half. By modifying the power supply master control 30 and/or the microcontrollers 60 to run the power supplies 50 at maximum efficiency point current (i.e., 40%-70% of its peak current) in high current mode, exemplary embodiments make it possible to boot up a storage disk 74 from a cold start 25-50% faster than conventional methods, at the same time consuming less total power due to the higher operating efficiency of the power supplies 50. A cold start is when the rotating disks 74 are at rest (e.g., the quiescent state). In the unlikely event of a power supply component failure during boot, the power supply master control 30 and/or the microcontroller 60 reconfigures the remaining power supplies 50 to continue the boot operation (of the storage device 70) uninterrupted, but using lower currents and therefore taking more time. In the high current mode, the ability to recover more rapidly from a quiescent state means that the power management hypervisor 20 is able to take the storage device 70 into quiescent states more frequently, thereby saving additional power over long periods of use. In other words, the power management hypervisor 20 is configured to stop the disks 70 from spinning more frequently to save power. For example, an archival storage device 70 may not be utilized as often as a main storage device 70, and since the power management hypervisor 20 can request that the power supply master control 30 provide power to the archival storage device 70 in the high current mode, the power management hypervisor 20 does not have to worry about a lag in spin-up time since the high current mode can boot up the disks 74 of the archival storage device 70 much faster than boot-up in a normal mode.

Additional features of exemplary embodiments include the feedback control 40, which may be implemented in software and/or hardware. The feedback control 40 of the power supply 50 provides additional ability to the microcontroller 60 for monitoring power supply levels for current spikes and voltage spikes which may result from the additional switching from the normal mode to high current mode described in the present disclosure. Since all the power supplies 50 are designed to be capable of current steps at 25% of their peak load, this is not expected to be a concern. However, the feedback control 40 provides a closed-loop control system to allow early detection of instabilities by the microcontroller 60 and allows the microcontroller 60 to shut down the high current operation mode before any adverse effects occur to the power supply 50. Each power supply 50 is shown with its own feedback control 40 but it is understood that a central feedback control 40a could be included in the power supply monitor control 30 to monitor all power supplies 50. In exemplary embodiments, the feedback control 40 measures the feedback coming from the load of the storage device 40 and monitors for voltage spikes and current spikes, and if a voltage spike and/or current spike is too high for a certain period of time, the feedback control 40 causes the microcontroller 60 to ramp down the voltage and/or current for that particular power supply 50.

An additional feature of the power supply master control 30 is the ability to divide the higher operating current (which could also be power and/or voltage) equally across the power supply levels of all the power supplies 50, so that each power supply 50 never exceeds the individual current limits of a given level for each power supply 50. For example, if the power supply system 80 is using an N+1=3 design, then the maximum bring-up current delta (which is the high current in high current mode being requested by the hypervisor 20) will be divided evenly among all three power supplies 50. The following example is provided to illustrate an implementation of the high current mode.

First, the power supply master control 30 may poll each microcontroller 60 for its present output current (e.g., at 30-33% of its maximum capacity during normal mode) and voltage levels as well as the microcontroller's maximum output current limit. The microcontrollers 60 control the current output for its respective power supply 50. The power supply master control 30 receives (and stores) from each microcontroller 60 the present current output (which may be, e.g., 25% of its maximum) and the maximum current output (which would be available for high current mode) of each power supply 50. At some subsequent point in time, the power supply master control 30 may receive a command from the power management hypervisor 20 to restart the disks 74 of the storage device from a quiescent state using higher current levels of the high current mode. The (firmware of the) power supply master control 30 calculates the respective current load draw for each power supply 50 and instructs the microcontrollers 60 to increase their current proportional to these limits, by dividing the maximum current delta across all N available power supplies 50 and levels equally.

As an illustration using fictitious values, 3 microcontrollers 60 of redundant power supplies 50 may be presently (in normal mode) operating at 30% which is 3 amps, and each of the 3 microcontrollers 60 has a maximum 100% output current of 10 amps (e.g., in high current mode); this information is passed to the power supply master control 30. When the hypervisor 20 requests the high output mode (with a total current of 18 amps) to start the start the disks 74 from rest, the power supply master control 30 is configured to calculate the respective current load for each of the 3 individual microcontrollers 60 by dividing the requested 18 amps by 3 (which is the number of redundant power supplies 50). As such, each microcontroller 60 would be requested (by the power supply master control 30) to increase their respective current output by 3 amps to result in an output current of 6 amps for the high current mode. In high current mode, the power supply master control 30 would cause the 3 power supplies 50 (via the microcontroller 60) to provide at total of 18 amps to the storage device 70, with each power supply 50 providing 6 amps (which is 60% of their maximum current output). If the fictitious total current requested by the hypervisor 20 was 21 amps, the power supply master control 30 would divide the total by 3 and cause the 3 power supplies 50 to each provide 7 amps of current in the high current mode.

Now back to the example, while the power supply levels adjust to meet the high current output of the high current mode, each microcontroller 60 monitors their respective power supply 50 for current spikes and/or spurious states using the closed loop feedback control 40; this allows the high current mode for any one or all of the respective power supplies 50 to be terminated by the microcontroller 60 if early signs of instability are measured. Otherwise, the high current mode is maintained for a predetermined time (e.g., several minutes or more) before the power supply master control 30 instructs the power supplies 50 (i.e., via the microcontroller 60) to return to their normal mode of redundant operation. For the brief period during the high current mode, the power supply master control 30 may not operate the power supplies 50 in a redundant configuration where backup is available. Once the system boot (and/or any other predefined event) of the storage device 70 is complete, the hypervisor 20 instructs the power supply master control 30 to return to normal mode.

The power supply master control 30 reconfigures (via the microcontrollers 60) the power supplies 50 to their normal redundant operation.

Also, in exemplary embodiments, the power supplies 50 could be reconfigured by the power supply master control 30 on demand to run in higher current mode for short periods, for example, in response to high workload conditions for the storage device 70. Accordingly, the power management hypervisor 20 can request current for the high current output mode to the power supply master control 30 at predefined conditions, and the power supply master control 30 calculates the respective current requirements for each individual microcontroller 60 by dividing the total requested current by the available (e.g., 3) power supplies 50.

Note that the power supplies 50 are always tested at their maximum ratings for electromagnetic compatibility (EMC) compliance, so there are no EMC related issues associated with the proposed operation of exemplary embodiments. This approach of exemplary embodiments has the potential to provide faster returns to normal operation following a quiescent period for disk storage (and/or to provide faster system boot from a cold start). Also, as discussed herein, energy is saved in several ways. First, the ability to recovery faster from a quiescent state means that the hypervisor 20 can put the storage device 70 into quiescent states more frequently. Second, when in high current mode, the power supplies 50 operate at higher efficiency with reduced cooling requirements. By the present disclosure, one skilled in the art understands that exemplary embodiments provide features that may be utilized in other storage and server equipment by various manufacturers.

Figure 2:
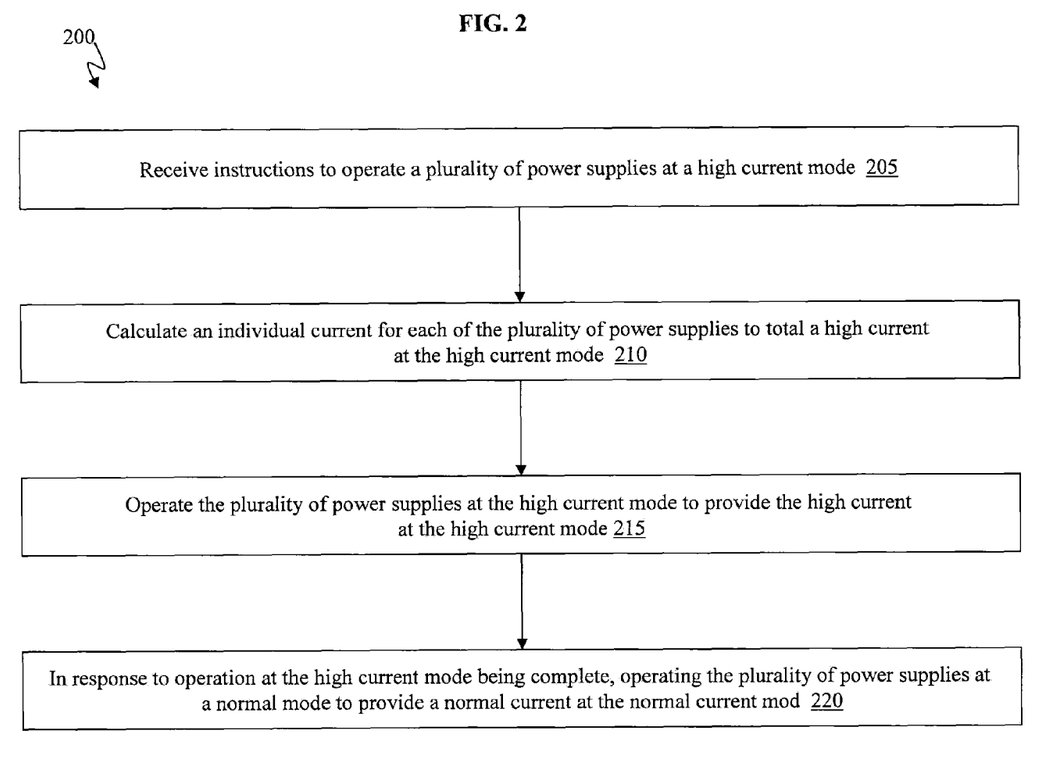
FIG. 2 depicts a flow chart in accordance with exemplary embodiments.

FIG. 2 illustrates a flow chart 200 in accordance with exemplary embodiments.

At operation 205, the power supply master control 30 is configured to receive instructions to operate the power supplies 50 at a high current mode. For example, the hypervisor 20 may request a certain amount X of high current in the high current mode to spin-up and/or boot-up the disks 74 and the power supply master control 30 determines if it can meet this request. The power supply master control 30 obtains the present amount of current that each power supply 50 is outputting, which should be roughly ¼ of its maximum capacity, and obtains the maximum amount of current that each power supply 50 can output. With this information the power supply master control 30 determine how to divide the requirement for X amount of high current among the power supplies.

At operation 210, the power supply master control 30 is configured to calculate an individual current that is required for each the power supplies 50 such that the total of the individual current equals the high current (X) in the high current mode. If there are 3 power supplies 50, the power supply master control 30 cause each power supply 50 to output individual current in the amount A, such that individual currents A+A+A=X which is the high current amount.

At operation 215, the power supply master control 30 is configured to operate the power supplies 50 at the high current mode to provide the X amount of high current at the high current mode to the storage device 70.

In response to operation at the high current mode being complete such as when the disks 74 spin-up to a nominal speed, the power supply master control 30 is configured to operate the power supplies 50 at a normal mode to provide a normal amount (Y) of current to the storage device 70.

Further, when the power supply master control 30 obtains the 3 present current output for each individual power supply 50, the power supply master control 30 causes each of the 3 power supplies to individually increase their present current outputs to the calculated individual current (A) respectively, such that the total of the individual current provides the X amount of high current at the high current mode. When operating the power supplies 50 at the high current mode to provide the X amount of high current, the high current mode causes the power supplies 50 to operate more efficiently than the normal mode, and/or operate at a lower temperature than the normal mode. When operating the power supplies 50 at the high current mode to provide the high current, the operating in the high current mode causes the power supplies 50 to briefly stop operating in a redundant power supply configuration. When the brief time in the high current mode is over (such as when the disks 74 reach a nominal operating speed of a certain amount of revolutions per minute (RPM)) and/or after a predefined amount of time (e.g., after several minutes), the power supply master control 30 can instruct the microcontrollers 60 to return to normal mode which is the redundant power supply configuration. Also, the power supply master control 30 may receive an indication to return to normal mode from the hypervisor 20 because the disks 74 have reached the nominal operating speed.

Figure 3:
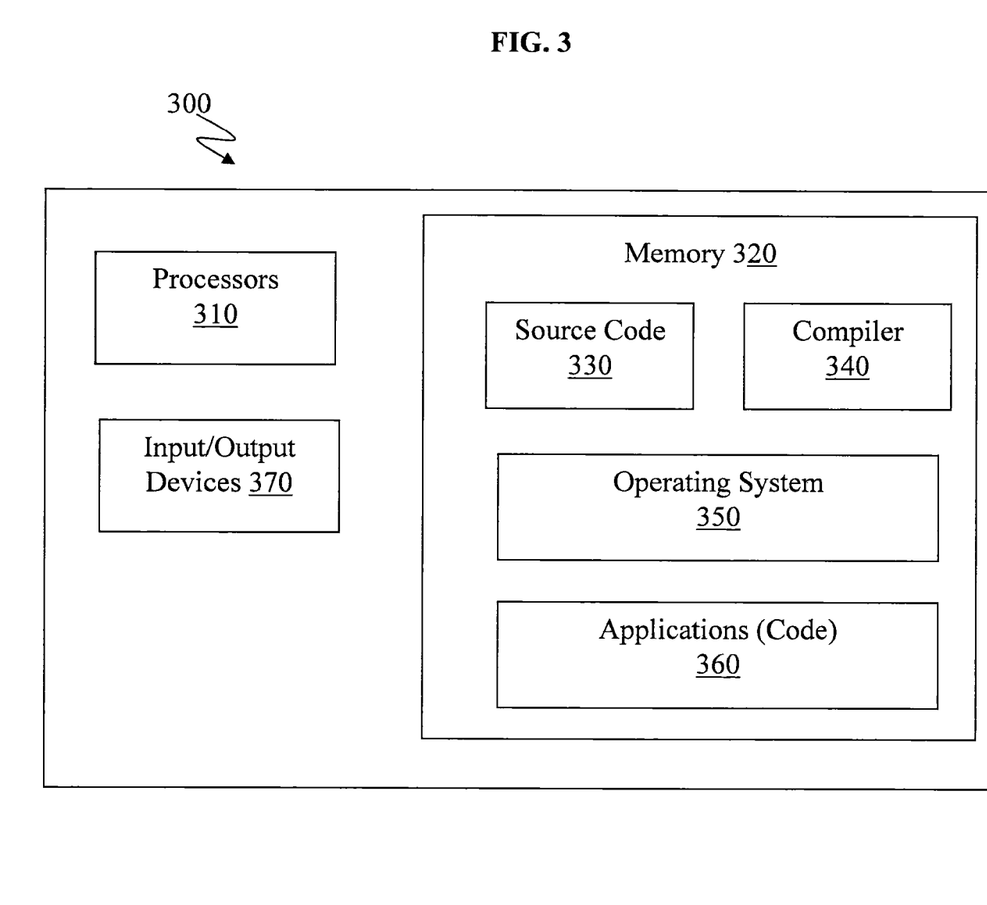
FIG. 3 depicts a computer that may utilized to implement exemplary embodiments.

FIG. 3 illustrates an example of a computer 300 having capabilities, which may be included in exemplary embodiments. Various methods, procedures, modules, flow diagrams, tables, and techniques discussed herein may also incorporate and/or utilize the capabilities of the computer 300. Moreover, capabilities of the computer 300 may be utilized to implement features of exemplary embodiments discussed herein. One or more of the capabilities of the computer 300 may implement and/or complement any element discussed herein.

Generally, in terms of hardware architecture, the computer 300 may include one or more processors 310, computer readable storage memory 320, and one or more input and/or output (I/O) devices 370 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 310 is a hardware device for executing software that can be stored in the memory 320. The processor 310 can be virtually any custom made or commercially available processor, a central processing unit (CPU), a data signal processor (DSP), or an auxiliary processor among several processors associated with the computer 300, and the processor 310 may be a semiconductor based microprocessor (in the form of a microchip) or a macroprocessor.

The computer readable memory 320 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cassette or the like, etc.). Moreover, the memory 320 may incorporate electronic, magnetic, optical, and/or other types of storage media. Note that the memory 320 can have a distributed architecture, where various components are situated remote from one another, but can be accessed by the processor 310.

The software in the computer readable memory 320 may include one or more separate programs, each of which comprises an ordered listing of executable instructions for implementing logical functions. The software in the memory 320 includes a suitable operating system (O/S) 350, compiler 340, source code 330, and one or more applications 360 of the exemplary embodiments. As illustrated, the application 360 comprises numerous functional components for implementing the features, processes, methods, functions, and operations of the exemplary embodiments. The application 360 of the computer 300 may represent numerous applications, agents, software components, modules, interfaces, controllers, etc., as discussed herein but the application 360 is not meant to be a limitation. The operating system 350 may control the execution of other computer programs, and provides scheduling, input-output control, file and data management, memory management, and communication control and related services.

The application(s) 360 may employ a service-oriented architecture, which may be a collection of services that communicate with each. Also, the service-oriented architecture allows two or more services to coordinate and/or perform activities (e.g., on behalf of one another). Each interaction between services can be self-contained and loosely coupled, so that each interaction is independent of any other interaction. Further, the application 360 may be a source program, executable program (object code), script, or any other entity comprising a set of instructions to be performed. When a source program, then the program is usually translated via a compiler (such as the compiler 340), assembler, interpreter, or the like, which may or may not be included within the memory 320, so as to operate properly in connection with the O/S 350. Furthermore, the application 360 can be written as (a) an object oriented programming language, which has classes of data and methods, or (b) a procedure programming language, which has routines, subroutines, and/or functions.

The I/O devices 370 may include input devices (or peripherals) such as, for example but not limited to, a mouse, keyboard, scanner, microphone, camera, etc. Furthermore, the I/O devices 370 may also include output devices (or peripherals), for example but not limited to, a printer, display, etc. Finally, the I/O devices 370 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 370 also include components for communicating over various networks, such as the Internet or an intranet. The I/O devices 370 may be connected to and/or communicate with the processor 310 utilizing Bluetooth connections and cables (via, e.g., Universal Serial Bus (USB) ports, serial ports, parallel ports, FireWire, HDMI (High-Definition Multimedia Interface), etc.).

When the computer 300 is in operation, the processor 310 is configured to execute software stored within the memory 320, to communicate data to and from the memory 320, and to generally control operations of the computer 300 pursuant to the software. The application 360 and the O/S 350 are read, in whole or in part, by the processor 310, perhaps buffered within the processor 310, and then executed.

When the application 360 is implemented in software it should be noted that the application 360 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 360 can be embodied in any computer-readable medium 320 for use by or in connection with an instruction execution system, apparatus, server, or device, such as a computer-based system, processor-containing system, or other system that can fetch the instructions from the instruction execution system, apparatus, or device and execute the instructions. In the context of this document, a "computer-readable storage medium" can be any means that can store, read, write, communicate, or transport the program for use by or in connection with the instruction execution system, apparatus, or device. The computer readable medium can be, for example but not limited to, an electronic, magnetic, optical, or semiconductor system, apparatus, or device.

In exemplary embodiments, where the application 360 is implemented in hardware, the application 360 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
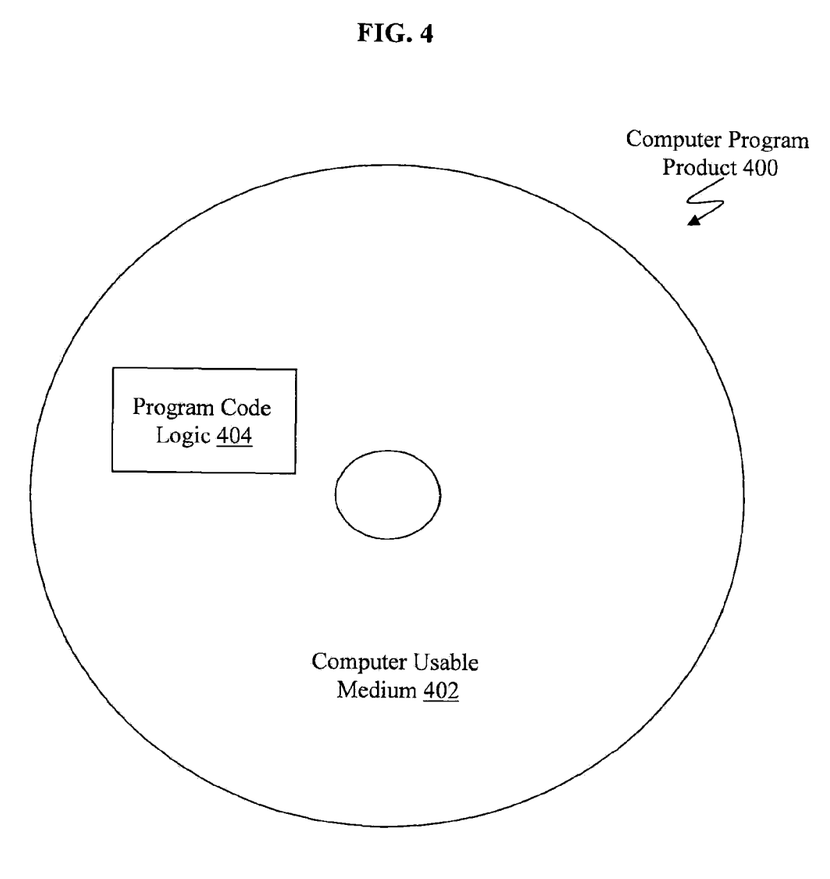
FIG. 4 depicts a computer program product that may be implemented by an exemplary embodiment.

As described above, embodiments can be embodied in the form of computer-implemented processes and apparatuses for practicing those processes. In exemplary embodiments, the invention is embodied in computer program code executed by one or more network elements. Embodiments include a computer program product 400 as depicted in FIG. 4 on a computer usable medium 402 with computer program code logic 404 containing instructions embodied in tangible media as an article of manufacture. Exemplary articles of manufacture for computer usable medium 402 may include floppy diskettes, CD-ROMs, hard drives, universal serial bus (USB) flash drives, or any other computer-readable storage medium, wherein, when the computer program code logic 404 is loaded into and executed by a computer, the computer becomes an apparatus for practicing the invention. Embodiments include computer program code logic 404, for example, whether stored in a storage medium, loaded into and/or executed by a computer, or transmitted over some transmission medium, such as over electrical wiring or cabling, through fiber optics, or via electromagnetic radiation, wherein, when the computer program code logic 404 is loaded into and executed by a computer, the computer becomes an apparatus for practicing the invention. When implemented on a general-purpose microprocessor, the computer program code logic 404 segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:
1. A method for power supply operation, comprising:
receiving an instruction to operate a plurality of power supplies at a high current mode, each of the power supplies comprises an individual feedback controller;

wherein the power supplies are redundant and serve as backups to one another to ensure that there is not a single point of failure as a redundant power supply configuration;

wherein the power supplies are connected to a storage device having planar disks for reading and writing data;

calculating an individual current for each of the plurality of power supplies to total a high current at the high current mode;

operating the plurality of power supplies at the high current mode to provide the high current at the high current mode to the storage device having the planar disks for reading and writing data;

in response to operation at the high current mode being complete, operating the plurality of power supplies at a normal mode to provide a normal current at the normal mode;

wherein operating the plurality of power supplies to supply the high current of the high current mode while causing the plurality of power supplies to operate at a higher efficiency than the normal mode and operate at a lower temperature than the normal mode, each of the plurality of power supplies that operate at the lower temperature while supplying the high current;

the plurality of power supplies increasing output to a load to operate at the lower temperature while supplying the high current of the high current mode;

wherein operating the plurality of power supplies to supply the high current at the high current mode occurs when booting up the planar disks of the storage device, which results in stopping the plurality of power supplies from operating in the redundant power supply configuration to the storage device such that the power supplies are no longer redundant and do not serve as backups to one another;

wherein operating the plurality of power supplies to supply the high current at the high current mode occurs when starting the planar disks of the storage device from rest, which results in stopping the plurality of power supplies from operating in the redundant power supply configuration to the storage device such that the power supplies are no longer redundant and do not serve as backups to one another;

wherein operating the plurality of power supplies to supply the high current at the high current mode occurs when demand for the storage device is high, which results in stopping the plurality of power supplies from operating in the redundant power supply configuration to the storage device such that the power supplies are no longer redundant and do not serve as backups to one another; and wherein operating the plurality of power supplies at the normal mode to provide the normal current causes the plurality of power supplies to again start operating in the redundant power supply configuration.

2. The method of claim 1, wherein a power manager receives the instruction for the high current mode; and
wherein the power manager calculates the individual current for each of the plurality of power supplies by dividing the high current by a number of the plurality of power supplies.

3. The method of claim 1, wherein calculating the high current at the high current mode for each of the plurality of power supplies comprises:
obtaining a maximum current rating in high efficiency range for each of the plurality of power supplies;
causing the total of the individual current for each of the plurality of power supplies to equally sum to the high current at the high current mode without exceeding the maximum current rating in the high efficiency range for any one of the plurality of power supplies.

4. The method of claim 1, wherein calculating the high current at the high current mode for each of the plurality of power supplies comprises:
obtaining present current outputs for each of the plurality of power supplies;
dividing the high current by a number of the plurality of power supplies to determine the individual current for each of the plurality of power supplies; and
causing each of the plurality of power supplies to individually increase present current outputs to the individual current respectively, such that the total of the individual current provides the high current at the high current mode.

5. The method of claim 1, wherein the high current mode operates each of the power supplies in a range of its respective maximum current.

6. The method of claim 1, wherein a power manager divides the high current at the high current mode among the plurality of power supplies, such that no one of the plurality of power supplies exceeds it maximum current capacity in high efficiency range; and
wherein when no one of the plurality of power supplies will exceed its maximum capacity in the high efficiency range, the power manager divides the high current at the high current mode equally among the plurality of power supplies.

7. The method of claim 1, wherein the plurality of power supplies are redundant power supplies;
wherein in the normal mode each of the plurality of power supplies individually operates in a region of one-fourth of maximum capacity; and
wherein in the high current mode each of the plurality of power supplies individually operates in a region of maximum current in high efficiency range.

8. The method of claim 1, further comprising in response to operating the plurality of power supplies in the high current mode, taking the storage device into quiescent states more frequently in which disks of the storage device stop spinning.

9. The method of claim 1, wherein operating the plurality of power supplies at the high current mode is configured to cause the storage device receiving the high current to:
spin-up faster from rest than in the normal mode; and
boot-up faster than in the normal mode.

10. The method of claim 1, wherein a feedback control monitors the plurality of power supplies to detect current spikes and voltage spikes when operating at the high current mode; and
wherein the feedback control causes the plurality of power supplies to exit the high current mode when current spikes or voltage spikes are detected for a predefined time.

11. A power system, comprising:
power supplies configured to provide redundant power, each of the power supplies comprises an individual feedback controller;
wherein the power supplies are redundant and serve as backups to one another to ensure that there is not a single point of failure as a redundant power supply configuration;
wherein the power supplies are connected to a storage device having planar disks for reading and writing data; and a power manager configured to control the power supplies, wherein the power manager is configured to:

receive an instruction to operate the power supplies at a high current mode;

calculate an individual current for each of the power supplies in which a total of the individual current amounts to a high current at the high current mode;

operate the power supplies at the high current mode to provide the high current to the storage device having the planar disks for reading and writing data; and in response to operation at the high current mode being complete, operate the power supplies at a normal mode to provide a normal current at the normal mode;

wherein operating the power supplies to supply the high current of the high current mode while causing the power supplies to operate at a higher efficiency than the normal mode and operate at a lower temperature than the normal mode, each of the power supplies that operate at the lower temperate while supplying the high current;

the power supplies increasing output to the storage device having the planar disks to operate at the lower temperature while supplying the high current of the high current mode;

wherein operating the plurality of power supplies to supply the high current at the high current mode occurs when booting up the planar disks of the storage device, which results in stopping the plurality of power supplies from operating in the redundant power supply configuration to the storage device such that the power supplies are no longer redundant and do not serve as backups to one another;

wherein operating the plurality of power supplies to supply the high current at the high current mode occurs when starting the planar disks of the storage device from rest, which results in stopping the plurality of power supplies from operating in the redundant power supply configuration to the storage device such that the power supplies are no longer redundant and do not serve as backups to one another;

wherein operating the plurality of power supplies to supply the high current at the high current mode occurs when demand for the storage device is high, which results in stopping the plurality of power supplies from operating in the redundant power supply configuration to the storage device such that the power supplies are no longer redundant and do not serve as backups to one another; and wherein operating the plurality of power supplies at the normal mode to provide the normal current causes the plurality of power supplies to again start operating in the redundant power supply configuration.

12. The power system of claim 11, wherein the power manager is configured to calculate the high current at the high current mode for each of the power supplies by:

obtaining a maximum current rating for each of the power supplies;

causing the total of the individual current for each of the power supplies to equally sum to the high current at the high current mode without exceeding the maximum current rating in high efficiency range for any one of the power supplies.

13. The power system of claim 11, wherein the power manager is configured to calculate the high current at the high current mode for each of the power supplies by:

obtaining present current outputs for each of the power supplies;

dividing the high current by a number of the power supplies to determine the individual current for each of the power supplies; and causing each of the power supplies to individually increase present current outputs to the individual current respectively, such that the total of the individual current provides the high current at the high current mode.

14. The power system of claim 11, wherein the power manager is configured to execute the high current mode such that each of the power supplies operates at its respective maximum current.

15. The power system of claim 11, wherein in the normal mode the power manager is configured to individually operate each of the power supplies in a region of one-third of maximum capacity; and wherein in the high current mode the power manager is configured to individually operate each of the power supplies individually in a region of maximum capacity.

16. The power system of claim 11, wherein when the power manager operates the power supplies at the high current mode, the high current mode is configured to cause a device receiving the high current to: spin-up faster from rest than in the normal mode, and boot-up faster than in the normal mode.

* * * * *